United States Patent
Soininen et al.

[19]

[11] Patent Number: 5,855,680
[45] Date of Patent: Jan. 5, 1999

[54] APPARATUS FOR GROWING THIN FILMS

[75] Inventors: Pekka Soininen, Helsinki; Janne Patteri, Vantaa, both of Finland

[73] Assignee: Neste Oy, Espoo, Finland

[21] Appl. No.: 682,704

[22] PCT Filed: Nov. 28, 1995

[86] PCT No.: PCT/FI95/00657

§ 371 Date: Sep. 25, 1996

§ 102(e) Date: Sep. 25, 1996

[87] PCT Pub. No.: WO96/17106

PCT Pub. Date: Jun. 6, 1996

[30] Foreign Application Priority Data

Nov. 28, 1994 [FI] Finland ..................................... 945610

[51] Int. Cl.$^6$ ................................................. C23C 16/00
[52] U.S. Cl. ........................... 118/719; 118/725; 118/726
[58] Field of Search .................................... 118/715, 719, 118/725, 726

[56] References Cited

U.S. PATENT DOCUMENTS

| | | |
|---|---|---|
| 3,730,696 | 5/1973 | Pointu et al. . |
| 4,058,430 | 11/1977 | Suntola et al. . |
| 4,062,318 | 12/1977 | Ban et al. . |
| 4,263,872 | 4/1981 | Ban . |
| 4,339,645 | 7/1982 | Miller . |
| 4,389,973 | 6/1983 | Suntola et al. . |
| 4,413,022 | 11/1983 | Suntola et al. . |
| 4,421,786 | 12/1983 | Mahajan et al. . |
| 4,825,806 | 5/1989 | Tawada et al. . |
| 4,993,357 | 2/1991 | Scholz . |
| 5,038,711 | 8/1991 | Dan et al. . |
| 5,091,335 | 2/1992 | Grunthaner et al. . |
| 5,183,510 | 2/1993 | Kimura . |

FOREIGN PATENT DOCUMENTS

| | | |
|---|---|---|
| 0015390 A1 | 9/1980 | European Pat. Off. . |
| 0 559 326 A1 | 9/1993 | European Pat. Off. . |
| 31 48 620 C2 | 5/1986 | Germany . |
| 37 39 528 A1 | 11/1987 | Germany . |
| 39 36 016 A1 | 10/1989 | Germany . |
| A 59-111997 | 6/1984 | Japan . |
| 61-26217 | 2/1986 | Japan . |
| 61-289623 | 12/1986 | Japan . |
| A 63-112495 | 5/1988 | Japan . |

OTHER PUBLICATIONS

Garnache et al., "Deposit and Clean Depositin System," *IBM Technical Disclosure Bulletin*, vol. 13, No. 7, Dec. 1970, p. 2083.

Suntola, "Atomic Layer Epitaxy," *Thin Solid Films*, 216, 1992, pp. 84–89.

*Primary Examiner*—Richard Bueker
*Attorney, Agent, or Firm*—Sterne, Kessler, Goldstein & Fox P.L.L.C.

[57] ABSTRACT

An apparatus for growing thin films onto a substrate by subjecting the substrate to alternately repeated surface reactions of vapor-phase reactants for the purpose of forming a solid-state thin film. The apparatus includes a reaction chamber pack into which the substrate is placed. The apparatus further includes at least two reactant sources, from which the reactants can be fed in the form of gas-phase pulses into the reaction chamber pack. The apparatus further includes reactant inflow channels for connecting the reactant sources to the reaction chamber pack. The reaction chamber pack, the reactant sources and the reactant inflow channels are all placed inside the same pressure shell. The reaction chamber pack and the reactant sources are each provided with individual heaters, which heat the reaction chamber pack and each reactant source, so that each heater is independently controllable from each other. Further, active thermal insulation elements thermally isolate the heaters from each other. These active thermal insulation elements are capable of controlling the internal temperature of the pressure shell independently from the temperatures of the reactant sources and the reaction chamber pack. The apparatus allows the temperatures of the reactant sources and the reaction chamber pack to be rapidly elevated and lowered, respectively, with low heat loss.

16 Claims, 2 Drawing Sheets

APPARATUS FOR GROWING THIN FILMS

BACKGROUND OF THE INVENTION

1. Background of the Invention

The present invention relates to an apparatus according to the preamble of claim 1 for growing thin films on a substrate, in which apparatus the substrate is subjected to alternately repeated surface reactions of vapor-phase reactants for the purpose of forming a solid-state thin film on the substrate through said surface reactions.

The apparatus comprises a reaction chamber pack into which the substrate can be placed, at least two reactant sources from which the reactants used in the thin-film growth process can be fed in the form of vapor-phase pulses into the reaction chamber pack, reactant inflow channels suited for connecting the reactant sources to the reaction chamber pack, and outflow channels connected to the reaction chamber pack suited for removing the gaseous reaction products of the growth process and the excess reactants.

2. Related Art

Conventionally, thin-films are grown using vacuum evaporation deposition, the Molecular Beam Epitaxy (MBE) and other vacuum deposition methods, different variants of the Chemical Vapor Deposition (CVD) method (including low-pressure and metal-organic CVD and plasma-enhanced CVD), or alternatively, the above-described deposition method of alternately repeated surface reactions called the Atomic Layer Epitaxy method, or in short, ALE. In the MBE and CVD methods, the growth-rate-affecting process variables also include the concentrations of the starting material inflows. To achieve a uniform thickness of the layers deposited by the first category of conventional methods, the concentrations and reactivities of starting materials must be carefully kept constant all over the substrate area. If the starting materials are allowed to mix with each other prior to reaching the substrate surface as is the case in the CVD method, for instance, a chance of their mutual reaction arises. Then, the risk of microparticle formation already within the inflow channels ol the gaseous reactants is imminent. Such microparticles have a deteriorating effect on the quality of the thin film growth. Therefore, the possibility of premature reactions in MBE and CVD reactors is avoided by heating the starting materials not earlier than at the substrate surfaces. In addition to heating, the desired reaction can be initiated using, e.g., a plasma or other similar activating means.

In the MBE and CVD processes, the growth of thin films is primarily adjusted by controlling the inflow rates of starting materials impinging on the substrate. By contrast, the ALE process is based on allowing the substrate surface qualities rather than the starting material concentrations or flow variables to control the deposition rate. The only prerequisite in the ALE process is that the starting material is available in sufficient concentration for film formation on all sides of the substrate.

The ALE method is described in the FI patent publications 52,359 and 57,975 and in the U.S. Pat. Nos. 4,058,430 and 4,389,973, in which also some apparatus embodiments suited to implement this method are disclosed. Equipment constructions for growing thin films are also to be found in the following publications: Thin Solid Films, 225 (1993), pp. 96–98, Material Science Reports 4(7) (1989), p. 261, and Tyhjiötekniikka Finnish publication for vacuum techniques), ISBN 951-794-422-5, pp. 253–261.

In the ALE growth method, atoms or molecules are arranged to continuously sweep over the substrates thus impinging on their surface so that a fully saturated molecular layer is formed thereon. According to the conventional techniques known from the FI patent publication No. 57,975, the saturation step is followed by an inert gas pulse forming a diffusion barrier which sweeps away the excess starting material and the gaseous reaction products from above the substrate. The successive pulses of starting materials and diffusion barriers of inert gas separating the former accomplish the growth of the thin film at a rate controlled by the surface chemistry properties of the different materials. Such a reactor is called a "traveling-wave" reactor. For the function of the process it is irrelevant whether the gases or the substrates are moved, but rather, the different starting materials of the successive reaction steps shall be separated from each other and arranged to flush the substrate sequentially.

When a hot-wall reactor is used, the wall is generally heated by mounting the heater elements and the insulation about a pressure-tight shell. Due to the elevated temperatures employed, inorganic fiber materials or bricks must be used as the insulation materials. The handling and mounting of such insulation release dust in the process equipment location. This poses a conflict with the conventional placement of deposition equipment in a clean room environment due to the risk of film growth disorders caused by dust particles becoming entrapped from the atmospheric air into the film being deposited.

Further, heating of the pressure shell of the deposition equipment also curtails the selection of usable materials fulfilling the requirements of resisting stresses from pressure and heat and being inert at said temperatures with respect to the chemicals occurring in the reactions. Conventional ALE reactors have the pressure shell made of borosilicate or quartz glass and stainless steel. The frameworks of the reactors have an elongated shape and the pressure shells contained therein are heated.

Typically, due to the poor heat resistance of the elastomer seals employed, the deposition equipment is designed with an elongated shape having the operation inlets/outlets placed at the ends to provide a sufficient thermal gradient between the hot parts and the seals of the equipment. In large apparatuses, the heated masses and required heating powers become substantial, and thermal gradients which are difficult to eliminate are formed between the different parts of the equipment. This makes the equipment dimensions larger, and while the different sources of reactants must be thermally isolated from each other by placing the sources enclosed in separate heater casings with an isolating air gap between the casings, the entire apparatus assumes an elongated shape with separate, outward protruding source tubes. The sources may also be placed so that the reaction space is followed by the sources arranged in-line. In such a construction, the highest-temperature reaction space is situated at the other end of the apparatus and the sources are placed inside the zones of the elongated reactor so that the source requiring the lowest temperature is situated in the zone of lowest temperature farthest from the reaction space. A problem herein arises from the control of temperature gradient (because the source at the reaction space end of the source is operated at a higher temperature than at the other end of the source) and from the increased length of the apparatus.

A tubular construction may also require the use of concealed joints which may be inaccessible to the operator thus preventing him from positively verifying successful completion of connections to the substrate holder (this is because the channels of the substrate holder are connected to the other piping within the hot reaction tube).

Due to poor performance of any bearings in a hot environment, the substrate holder must be elevated to the reaction space by a slide or lift mechanism. This results in formation of abraded material dust on the sliding surfaces and scratching of glass substrates due to possible jerks during the movement.

The above-mentioned drawbacks are accentuated in the processing of larger-area substrates, whereby the size and control of the equipment and its components become more complicated.

It is an object of the present invention to overcome the drawbacks of conventional technology and to provide an entirely novel apparatus for growing thin films using the ALE process. It is a particular object of the invention to solve the problems associated with a heated pressure shell without compromising the benefits of a hot-wall reactor.

SUMMARY OF THE INVENTION

The goal of the invention is achieved by means of providing a hot-wall pulsed-flow reactor with the heating means adapted to the interior of the pressure shell, a radiation-reflecting insulation and an outermost cooled envelope which may be separate from the pressure shell or integrated thereto. According to the invention, the reaction chamber pack, the solid material sources and the starting material inflow channels are all placed inside the same pressure shell, whereby individual heating means are used for both the reaction chamber pack and the solid material sources. Each solid material source is adapted independently heatable, and the heatable components are isolated from each other with the help of actively cooled thermal insulation elements.

A further novel property of the invention is also the use of a heated loading door which facilitates, among other benefits, the placement of the door in the immediate vicinity of the reaction chamber pack. Then, the reactor can have the shape of, e.g., a cubicle, whereby verification of the tightness of internal joints/connections is easy to achieve.

More specifically, the apparatus according to the invention is principally characterized by what is stated in the characterizing part of claim 1.

In the embodiment according to the invention, the heating means of the reaction chamber pack and the sources can be formed by an envelope enclosing the reaction chamber pack or the source, respectively, said envelope having a first heat-equalizing envelope or plate placed to the side facing the reaction chamber pack (or the source, respectively), while a second heat-equalizing envelope or plate can be placed when desired to the side facing the pressure shell. Between the first and the second envelope is then adapted a heater element suited for heating the surfaces of the heat-equalizing envelopes. The heater elements may comprise, e.g., resistive tubular or planar heater elements. It shall be noted herein that in the apparatus according to the invention the heating means can also be operated in the single-side configuration of the heat-equalizing envelope.

The elements called hereinafter the active heat-isolating means typically comprise a cooling means and a radiation shield. Thus, the apparatus according to the invention has between two hotter points arranged a zone with a temperature lower than that of the cooler point of the two. About the heating means is typically disposed a set of thermal radiation reflecting envelopes with a number of at least one, while a greater number of concentric envelopes is also possible. Additionally, a cooling means is adapted about the sources, whereby said isolating zone is achieved. The cooling means may comprise, e.g., water cooling such as is closer depicted in FIG. 4. A similar cooling means may also be adapted to the pressure shell.

The walls of the shell structures enclosing the reaction chamber pack and the sources are most advantageously made from a metal such as stainless steel, titanium or aluminum, or alternatively, a metal alloy.

By keeping the reaction space and the reactant sources thermally isolated from each other and from the pressure shell, the internal temperature of the pressure shell can be adjusted independently from the temperature of the sources and the reaction space. In fact, the pressure shell temperature can be kept much below the reaction temperature.

Advantageously, the sources are divided into two groups, one of which comprising the metallic reactants and the other the nonmetallic reactants, whereby the sources of the same group of reactants can be arranged to use a common inflow channel. This may be implemented advantageously so that the sources of the same reactant group are arranged superimposed or in parallel, whereby they are connected at their one ends to a common combining manifold or an inflow channel, whose exit end is connected to the reaction chamber pack with the help of separate connection fittings, for instance.

In the context of the present invention, the term "reactant" refers to a vaporizable starting material capable of reacting with the surface of the substrate. The ALE method conventionally uses reactants selected from two separate groups. The reactants may be solids, liquids or gases. The term "metallic reactants" is used of metallic compounds which may even be elemental metals. Suitable metallic reactants are the halogenides of metals including chlorides and bromides, for instance, and metal-organic compounds such as the thd complex compounds. As examples of metallic reactants may be mentioned Zn, $ZnCl_2$, $Ca(thd)_2$, $(CH_3)_3Al$ and $Cp_2Mg$. The term "nonmetallic reactants" is used for compounds and elements capable of reacting with metallic compounds. The latter group is appropriately represented by water, sulfur, hydrogen sulfide and ammonia.

If the apparatus is designed into a cubic shape, its one side is constructed to form a loading/unloading door through which a stacked substrate pack forming the reaction space in a preassembled pack of reaction chambers can be admitted into the pressure vessel and removed therefrom after the reaction, respectively. According to a particularly advantageous embodiment, the door can be provided with a heating facility equivalent to the above-described heating means, said heating facility serving, e.g., to heat the gas-phase pulses of the reactant entering the reaction chamber pack from the sources via the inflow channels thus preventing the condensation of the reactant vapors. Then, there is no need to arrange separate heating means about inflow channels, but rather, it is sufficient to configure the apparatus so that the inflow channels are routed to run close to the heated door.

By virtue of the invention, significant benefits are gained over conventional ALE reactors used in the art:

The thermal insulation is formed by stacked, outdistanced, heat-reflecting sheets, each sheet having a low absorbance and emittance of heat radiation, thus acting as a set of adjacent thermal insulations in this low-pressure system. The sheets also act as conventional thermal insulation by preventing free flow of residual gases between the hot and cold parts of the reactor, whereby thermal conduction and convection are reduced. The insulation structure employed herein eliminates the need for using inorganic fiber or tile insulation.

Owing to the lower temperature of the pressure shell, its strength is retained high which is an important benefit when substrates of larger size are to be processed. Further, the design constrains set for the shape of a metallic pressure vessel operated at a lower temperature are relaxed, whereby the shape of the pressure shell may also comprise planar surfaces in a cost-competitive manner.

Due to the low temperature of the pressure shell, the dimensions of the apparatus need not be increased to accommodate the cooling of the seals. Simultaneously, the design need not be limited to elongated forms of the reactor, thus permitting unrestricted placement of the loading door on any side of the apparatus.

Use of a single type of internal heating/cooling arrangement also in the doors of the pressure shell facilitates bringing the loading door to the immediate vicinity of the source or the reaction chamber pack.

By virtue of the internal heating concept, thermal masses are minimized to be comprised simply of the sources, the transport and flow control manifolds of gases, the substrate holder, the substrates and the heating means themselves alone. This reduction of thermal masses facilitates rapid temperature elevation/lowering at a low power consumption in a manner also verified in actual tests.

When a joint is made between a larger diameter and smaller diameter pipe, for instance, by inserting the smaller pipe with a loose fitting into the larger-diameter pipe, a leaky joint results with a gap between the inner circumference of the larger pipe and the outer circumference ol the smaller pipe. Given a difference between the gas concentrations outside the pipe joint and its interior, a gas flow occurs from the higher concentration toward the lower concentration irrespective of whether the difference is due to partial pressure differentials or system pressure differentials. This flow can be called a leak and its magnitude is dependent on the pressure differential, prevailing pressure, gas properties and temperature. When the pressure is lowered from 1000 mbar to 1 mbar. the gas is rarified in the ratio 1:1000, whereby also the leak rate via the gap falls proportionally. This will be the case even if the gas is viscous under all conditions. When a gas is rarified close to its molecular state (that is, the density of gas molecules in the volume of a vacuum chamber is so low that the molecules impinge on each other much more rarely than against the chamber walls), which for small gap dimensions is in the order of 1 mbar, the leak rate is further lowered, because the gas molecules must enter the gap in a proper angle and correct position to pass through the gap. Accordingly, leak rates for joints within the vacuum apparatus are essentially smaller than the corresponding leak rates of similar joints at atmospheric pressure. By feeding a protective gas to the reactor volume surrounding the pipes under such conditions that the pressure outside the pipes is higher than in the pipes, a sealing flow can be provided from outside a joint to its interior. This results in still lower leak rates from the piping to its surroundings. The effect and its utilization are known in the art and scaling arrangements based thereon are used in ALE reactors. Hence, the piping can be made from a number of joined sections, whereby its construction using smaller and simpler components is possible. However, also herein for the correct function of the reactor it is crucial to verify the integrity of joints/connections of such components.

When the source is placed inside a compact module comprising a heater, a radiation shield and a cooler, the sources can be placed in the same space with the reaction chamber pack in parallel with the pack or, for instance, about it. This facilitates the placement of the entire apparatus inside, for instance, a cubic pressure shell. Then, the space required by the piping and the transmission distances of the gas flows are minimized, and the joints can be located to a point easily accessible from the loading door. Benefits achieved herein include smaller time constants, minimization of piping surfaces and a compact structure of the apparatus.

The placement of the sources surrounding the reaction chamber pack facilitates the connection of the sources to the substrate holder so that the operator can verify the integrity of the connection during every load cycle. This embodiment also simplifies the maintenance and cleaning of the apparatus.

Because the pressure shell, the heating system and the hot piping are separated from each other, the number and size of sources are easily varied.

Owing to the operation of the hot-wall piping within the pressure shell under a low pressure, the piping need not be designed for operation under pressure, whereby piping elements such as the substrate holder may be shaped as, e.g., a cubicle if such a form is more advantageous for the flow dynamics. Generally, the ALE reactors have the piping components made from borosilicate glass and quartz, the latter being extremely inert to chemicals occurring in the reaction. However, the mechanical strength of glass is inferior to that of steel.

As the bottom of the pressure shell is located on a cool floor, the substrate rack may be introduced into the reactor on a carriage moving on wheels running on rails mounted on the inner bottom of the pressure shell. Then, the loading carriage may be utilized in the transport of the heavy substrates and a reaction chamber pack surrounding them, and the loading carriage need not be elevated into the reactor with the help of, e.g., a fork lift.

Other benefits and characterizing properties of the invention will be evident from the following detailed description with reference to diagrams shown in the appended drawings in which FIG. 1 is a front view of the diagrammatic structure of a preferred embodiment of the apparatus according to the invention;

FIG. 3A is a side view of the cassette cabinet forming the reaction chamber pack with its cassette support structures and transfer cart, while

DETAILED DESCRIPTION OF THE PREFERRED EMBODIMENTS

Figure 1:
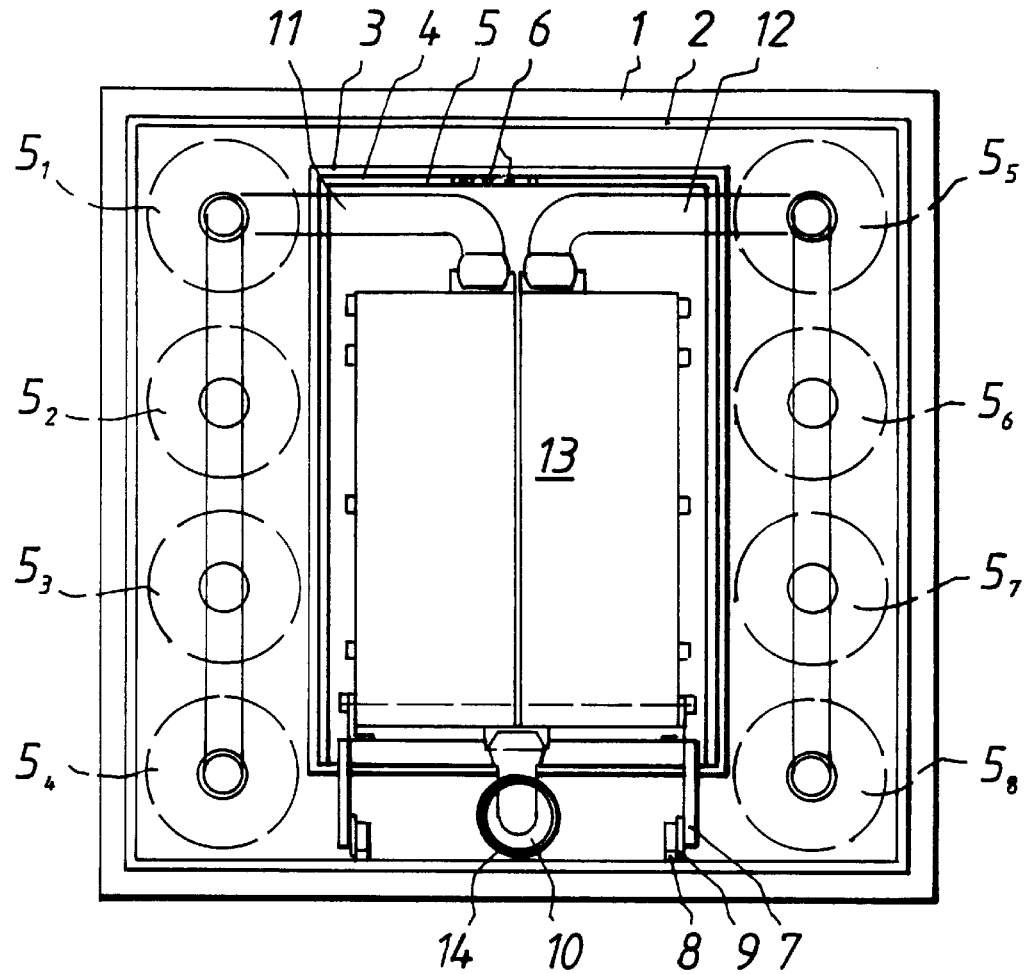

With reference FIG. 1, a pressure shell is shown denoted by reference numeral 1, the shell having a channel or manifold adapted to its outer surface for the circulation of a cooling medium. To the shell is also formed a groove 2 for the seal of a loading door.

Figure 4:
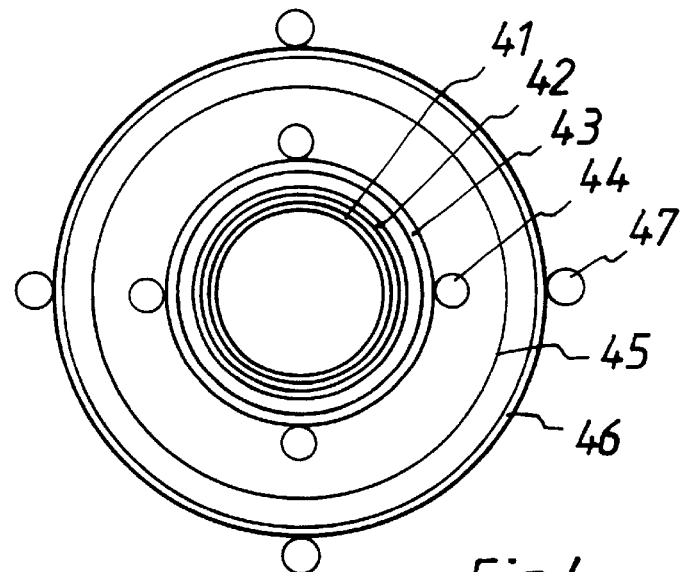
FIG. 4 is a cross-sectional view of the diagrammatic structure of the heatable source.

In the configuration illustrated in FIG. 1, to the interior of the pressure shell are adapted 8 solid material sources $S_1$–$S_8$ denoted by dashed line in the diagram. A solid material source in its simplest form refers to that part of the deposition apparatus in which a position is provided for placing solid materials and which contains a starting material in its boat. Such a solid material source is also considered to include its heater, thermal insulation and cooler plus components required for the pulsed inflow of the carrier gas and control of gas flows. Detailed structure of a solid material source is illustrated in FIG. 4.

Inside the pressure shell is further adapted a reaction chamber pack 13 surrounded by at least one thermal radiation shield plate 3 with a low absorption coefficient. The efficiency of such a plate (or plates) as an active thermal insulation element is based on the fact that the thermal radiation emitted from the heater element of the reaction chamber pack is reflected from the plate of a low absorption coefficient, and the small heat flow transmitted through the plate is poorly transmitted forward. Thermal isolation in the same fashion is repeated at the next adjacent plate and so on. With elevated pressure and increasing thermal transmission through both convection and conduction, the plates still improve the thermal insulation by impeding the movement of molecules.

The heating means of the reaction chamber pack comprises a planar heater incorporating two heat equalizing plates, namely an outer heat equalizing plate 4 and an inner equalizing plate 5 with a heater element 6 such as a resistive heater element adapted between the plates. The plates 4 and 5 may be of, e.g., stainless steel. Since their function is to equalize the heat flow emitted from the resistive heater elements 6 over the entire area remaining between the heater elements, the material of the plates should have a high thermal emissivity. In practice the temperature of the plates has been found to equalize well which in turn improves homogenous transfer of heat onto the substrate glasses. The heat equalizing plates 4, 5 and the thermal radiation shield plates 3 are stacked together with 4–5 screws, for instance, and separated by bushings. The thermal conductivity of the screws has been found negligible.

As mentioned above, the heater element of the reaction chamber pack 13 may comprise a tubular resistive heater 6, for instance. The function of the heater element is appropriately controlled by a thermoelement measuring the temperature of the heater element. A gas-tight vacuum-mountable tubular heater 6 with a homogeneous thermal flow from its surface is an example of a method of distributing the heat homogeneously to all sides of the heat equalizing plates 4, 5. The heating may also be implemented using any other suitable planar heating method.

All six walls of the internal reactor volume designed to accommodate the reaction chamber pack 13 can be heated by means of separately controlled resistive heater elements 6 in case the required heating power for geometrical reasons should be different on the different walls of the space. Otherwise, a single heater element could heat several walls, whereby the number of required feedthroughs is reduced. However, an essential requirement herein is that the reaction chamber pack is from every side surrounded by a wall of equal temperature, or alternatively, that the internal thermal conductivity of the reaction chamber pack is so high that it can equalize any inhomogeneities in the impinging thermal radiation flow. In practice, temperature differences less than 1 kelvin have been measured over a 30 cm distance on the thermal space surface.

The entire combination of the heater 6, the thermal insulation 4, 5, and the cooler 3, or alternatively, only a part thereof may be manufactured when required into an integrated heater module, whereby the replacement of the heater module is easy without requiring the dismantling of any other parts of the reactor and permitting revamping of the reactor heating system in compliance with technical advances.

The reactor chamber pack 13 is adapted onto a loading carriage 7. The reaction chamber pack and the substrates to be processed in the space are assembled outside the apparatus onto a loading carriage 7 mounted on a separate wheeled transfer cart (cf. also FIG. 4). The transfer cart is next pushed in front of the apparatus so that rails of the cart become a continuation of rails 8 on the inner bottom of the pressure shell, whereby the loading carriage 7 can be pushed into the interior of the pressure shell running on wheels 9 on the rails. The wheels 9 make the transfer of the loading carriage effortless and smooth. The function of the rails 8 is to ease the transfer of the loading carriage and facilitate its accurate alignment. Removal of the substrate holder/reaction chamber pack 13 from the reactor is a reverse operation of that described above. As no work against gravity is required during the carriage loading/unloading, also any special transfer equipment for moving the loading carriage and its transfer cart will be redundant. Furthermore, the reaction chamber pack may be preheated and it can be taken outside the reactor casing for cooling, whereby the process equipment handling time is reduced and the throughput capacity of the equipment is increased.

A condensation pipe 10 routed through the cold part of the pressure shell assures condensation of condensable excess chemicals and reaction products prior to the pumping line. The pipe is connected to the pressure shell 1 via a radial lip seal 14. The pipe is slidable in the longitudinal direction of the pipe along the lips of the radial lip seal which can also accommodate possible angular alignment errors. Thus, the connection of the pipe to the reaction chamber pack is easy even if slight variations should occur in the reaction chamber pack structure or the position of the loading carriage. The condensation pipe 10 is replacement part subject to contamination. Its mounting can he implemented by means of, e.g., a ball/socket joint. Solids and materials which are gaseous under the conditions prevailing in the pumping can be removed by, e.g., filtration, adsorption, cold traps and other similar means. As noted above, the connections may not necessarily need scaling.

In the ALE method, the film is grown only at areas subjected to both metallic and nonmetallic source vapors. Therefore, points where undesired film growth occurs, namely the other surfaces of the reaction chamber pack than the substrate surfaces, must be subjected at regular intervals to surface cleaning from grown film or the contaminated parts must be replaced by new ones.

The metallic and nonmetallic sources are separated from each other in order to prevent the growth of thick film multilayer accumulations formed by successive deposition of thin films over one another during a long series of runs. Such a thick film inevitably starts cracking after growing above a certain thickness. The separation arrangement of the sources also improves the efficiency of the use of the starting materials, because the films deposited on undesired areas unnecessarily represent a waste of the starting materials. Reference numerals 11 and 12 in the diagrams denote separate joint pieces intended for connecting the manifolds of metallic or nonmetallic sources to the reaction chamber pack. The connections are provided with ground ball/socket joints.

A substrate holder denoted by numeral 13 forms the reaction chamber pack. In this embodiment of the substrate holder structure, the substrates are sandwiched so that their front sides are facing and sealed at the edges thus forming the reaction space, and such packs of two substrates are then stacked in parallel side-by-side with the substrate rear sides facing outdistanced from each other at a defined spacing.

The temperature differentials possibly developing between the sandwiched substrate pair packs in the stack can be equalized by means of e.g., graphite heat-equalizing plates inserted between the packs. The starting material vapor flows entering the reaction chamber pack are gated into a sequence of gas pulses entering the gaps between stacked substrate packs at different times. In the gap, the molecules or atoms of the vaporized starting materials impinge on the hot surface of the substrate thus forming a saturated molecular layer of the substrate surface. The gases swept away from the reaction space are removed from the other end of the substrate packs, wherefrom they are taken through the condensation pipe. The heater elements may also form an integral part of the reaction chamber pack structure, whereby heat transfer to the reaction chamber pack and the substrates therein is maximized.

According to the exemplifying embodiment, a cold-wall ALE reactor can be assembled from the following modular subassemblies:

Pressure shell
Heater—thermal insulation—cooler
Solid material source
Piping
Reaction chamber pack
Loading carriage
Pumping line and pump
Control equipment
Software Each modular entity can be serviced separately, revamped to state-of-the-art level and even replaced by an entirely new construction without the need for replacing the other modules. The use of internal heating further contributes to the modularity of the reactor construction.

Sources using gaseous or liquid starting materials can be designed into individual modules fully separated from the rest of the reactor structures.

Figure 2:
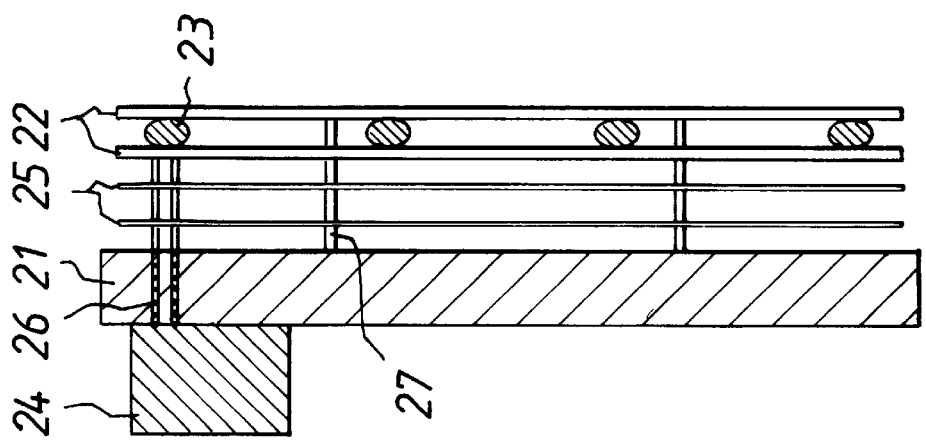
FIG. 2 is a side view of the structure of a heatable loading door.

As mentioned above, the embodiment of the apparatus according to the invention has a novel property in that a loading door with a heater is employed. Referring now to FIG. 2, the structure of such a door is shown. To this end, the loading door has at least one radiation shield plate 25 of a low radiation absorption coefficient attached to it. This plate provides the same function as the plates 3 described in the text above. The heating element of the door 21 constitutes a planar heater comprising two heat equalizing plates, 22, and a heater element 23 such as resistive heater elements placed between said plates. The plates 22 are of the same material as the other heat equalizing plates of the reactor and their function is to distribute the heat emitted by the resistive elements 23 evenly over the plate. The door mechanism further incorporates a control unit 23 of the heater elements, whereby the control unit assembly may simply incorporate, e.g., a control electronics cabinet connected via electrical cables 26 to the heater element. The radiation shield plates 25, the heat equalizing plates 22 and the heater element 23 are attached to the inner surface of the door by means of mounting brackets 27.

The above-described structure gives such advantages as the possibility of bringing the loading door close to the reaction chamber pack. Then, the reactor may be designed into the shape of a cubicle, for instance, whereby the integrity checking of joints/connections is easy. The heating means of the loading door can be utilized for heating the vapor-phase material pulses flowing from the reactant sources via the inflow piping to the reaction chamber pack so that condensation of vapors in the inflow piping is prevented.

Figure 3B:
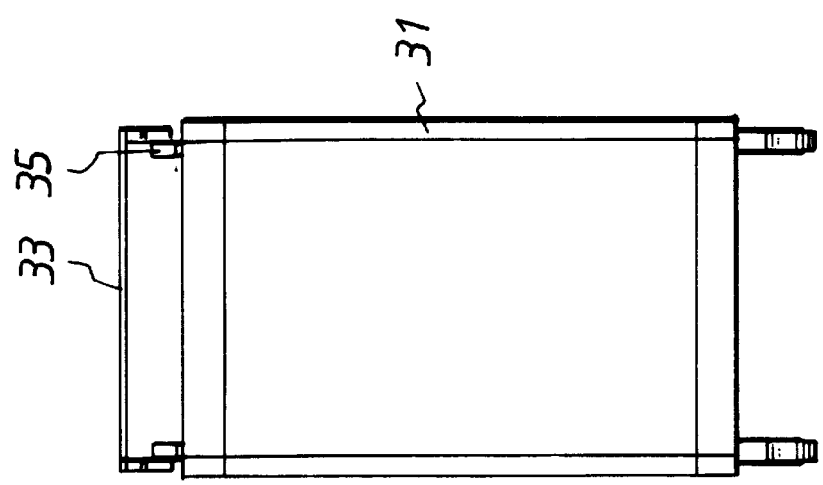
FIG. 3B illustrates the transfer cart.
Figure 3A:
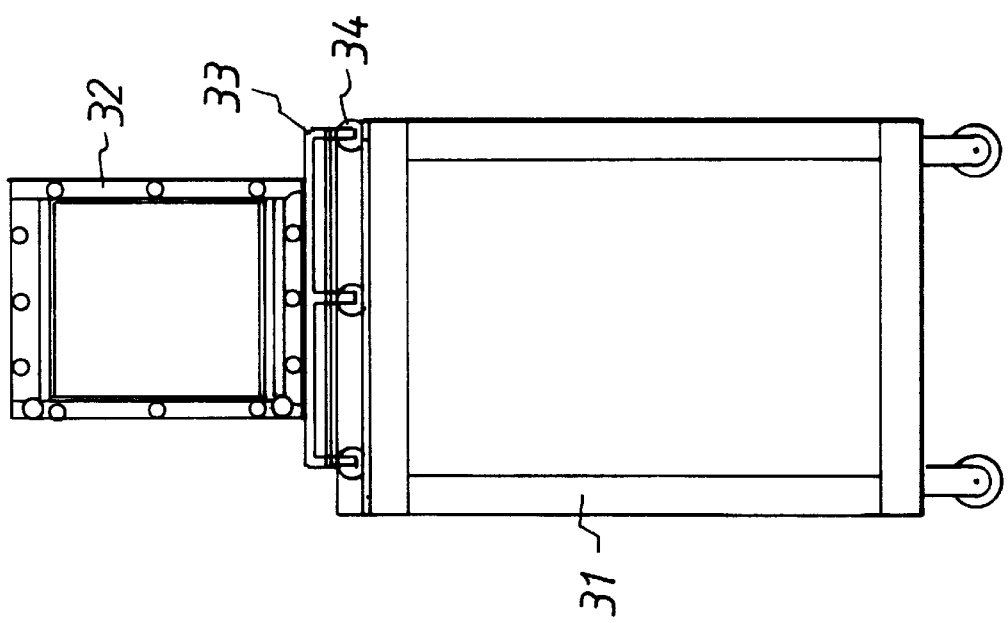

FIGS. 3A and 3B illustrate in greater detail the construction of the transfer cart 31 of the substrate holder 32. These diagrams also elucidate the placement of the substrate holder onto the loading carriage 33 and the location of the carriage wheels 34 and rails 35.

FIG. 4 shows a compact, modular solid material source suited for use in conjunction with the present invention. The modular source comprises an inner source tube 41 (conventionally of glass), into which the starting material boat can be placed. The inner source tube is surrounded by an outer source tube 42, which is also conventionally of glass. This tube may be formed into a contiguous, branched glass manifold, whose branches communicate with all the solid material sources of the same block that are thus combined with the help of the common manifold piping of the block. A scaling nitrogen flow is arranged to flush the gap between the source tubes 41, 42. Surrounding the source tubes is arranged a heat equalizing tube or plate 43, whose purpose is to equalize the heat emitted by the heater element 44 evenly on the surface between the resistive heater elements. Together with the resistive elements, the heat equalizing tube forms a tubular heater for the exemplifying embodiment described herein.

The heat-emitting elements 44 can be, e.g. tubular heaters, whose temperature is monitored by means of thermoelements. A tubular heater with an even surface temperature distribution is a method of distributing the heat evenly over the entire area of the heat equalizing plate. Alternatively any other heating means structure capable of providing homogeneous heating is feasible. Tubular reactors are typically constructed so that both ends of the reactor are equipped with resistive heater elements of higher output than that of the reactor center part heaters in order to compensate for the larger thermal losses of the ends. In the symmetrical heater—thermal insulation—cooler embodiment according to the invention, the steady heat sinking rate of the cooler is so high with respect to other thermal losses that heat removal through this route becomes dominating. Hence, when an even heat distribution is desired, steady heat input must necessarily be complemented with steady heat extraction.

The tubular heater element is enclosed by at least one thermal radiation insulation plate. The function of these plates is based on the fact that the thermal radiation emitted by the resistive elements is reflected from the adjacent plate of a low absorption coefficient and even the small heat flow transmitted through the plate is poorly transmitted forward. Thermal isolation in the same fashion is repeated at the next adjacent plate and so on. With elevated pressure and increasing thermal transmission through both convection and conduction, the plates still improve the thermal insulation by impeding the movement of molecules.

The outer casing of the modular source is formed by a temperature-distribution-equalizing cooling plate or tube 46 serving to collect also the heat flow emitted from the surface spanned between the outermost cooling elements 47. In the exemplifying embodiment, a pipe is used as the cooling element 47. A factor crucial to the dimensioning of both the heat-equalizing and cooling-equalizing plates is that the internal conduction of heat within the plate must be effective with respect to the heat flow received by, e.g., the surface between the cooling pipes. Here, the dimensioning is affected by the mutual distance between the cooling pipes, the sheet/pipe material, sheet/pipe wall thickness, permissible temperature differentials and the heat flow rate. The cooling element such as the pipe 47, for instance, removes along with the heat transfer medium (liquid or gas) the heat transmitted through the thermal insulation. When a pipe is used as the cooling element, the pipe must be vacuum-tight and preferably arranged to run without connections from outside the reactor into it and back to the exterior space. The cooling element is attached to the temperature-distribution-equalizing cooling plate by brazing, welding, mechanical or similar means of high thermal conductivity. The cooling-equalizing plate/pipe and the cooling element may be manufactured into an integrated structural component.

The reactor can have such a construction in which the heater, thermal insulation and cooler are assembled onto a separate source mounting flange in which also the radial lip seals of the glass tubes and process gas inlet/outlet connections can be combined. The opening made to the pressure shell of the reactor must have a diameter larger than that of the cooling element. The size of the modular source mounting flange and its seal are dictated by the diameter of the pressure shell opening. The number of solid material sources that can be connected to the reactor is primarily determined by the area available for mounting the adjacent source flanges. This kind of structure gives the solid material source a modular shape that permits easy addition, removal or replacement of the source in the reactor system. The construction of the modular source may be varied in a self-contained manner without requiring major changes in the other structures of the reactor.

Besides solid material sources, the reactor may be provided with an almost unlimited number of liquid and gas starting material sources. Hence, a greater number of more solid material sources can be added to the reactor system without cutting off the maximum number of the other sources. As the desired number of solid material sources affects the reactor dimensions, the maximum number of these sources is limited for each reactor construction.

The above-described reactor is operated as follows:

1. A desired number of metallic and nonmetallic starting material sources is connected to the reactor.
2. Into the sources are inserted, e.g., from the side of the loading door a multibranched glass manifold. Both groups of starting material sources are provided with an individual manifold.
3. Both inner source tubes are inserted via the source mounting flanges.
4. Into the inner source tubes are inserted the thermoelements and starting material boats each of them containing a starting material.
5. The reaction chamber pack is assembled and the substrates are placed therein.
6. The loading carriage and the reaction chamber pack are transferred on the transfer cart close to the reactor into a position having the rails of the transfer cart aligned as a continuation of the rails mounted to the bottom of the pressure shell.
7. The loading carriage is pushed into the reactor pressure shell up to its predetermined position and the transfer cart is withdrawn.
8. The connecting pipes between the source tubes and the reaction chamber pack are attached and the condensation pipe is mounted into its place. The integrity of the joints/connections is verified.
9. The loading door is closed and the reactor pressure shell is evacuated to a vacuum.
10. The system control program is started (to control heating and reactant flow pulse gating).
11. After the run, the reactor pressure shell is connected to atmospheric pressure and the loading door is opened.
12. The condensation pipe and the connecting pipes are removed and open pipe ends are provided with seal plugs.
13. The reaction chamber pack is removed and the loading carriage is moved from the reactor onto the transfer cart.

Provided that the starting materials in the sources are not yet exhausted, the sources can be left waiting for the next run, whereby their dismantling is unnecessary. When a greater number of reaction chamber packs is available, the next reaction chamber pack can be transferred into the reactor pressure shell and the run can be started immediately. The reaction chamber pack removed from the reactor can be left cooling undisturbed, and its dismantling, cleaning and reassembly can be made in good time prior to the next processing run.

What is claimed is:

1. An apparatus for growing compound thin films onto a substrate by subjecting the substrate to alternately repeated surface reactions of vapor-phase reactants for the purpose of forming a solid-state thin film, said apparatus comprising:
   a reaction chamber pack into which the substrate can be placed;
   a plurality of reactant sources from which the vapor-phase reactants used in a thin-film growth process can be fed in the form of gas-phase pulses into said reaction chamber pack; and
   a plurality of reactant inflow channels suited for connecting said reactant sources to said reaction chamber pack, wherein said reaction chamber pack, said reactant sources and said reactant inflow channels are all placed inside a pressure shell, and wherein said reaction chamber pack and said reactant sources are each provided with individual heating means for heating said reaction chamber pack and each of said reactant sources in a fashion independently controllable from each other, and wherein said heating means has a plurality of heatable components which are isolated from each other using active thermal insulation elements.

2. The apparatus according to claim 1, wherein the internal temperature of the pressure shell can be controlled independently from the temperatures of said reactant sources and said reaction chamber pack with the help of said active thermal insulation elements.

3. The apparatus according to claim 2, wherein said active thermal insulation element of said reaction chamber pack comprises at least a thermal radiation reflecting envelope adapted about a heater element of said reaction chamber pack.

4. The apparatus according to claim 3, wherein the heater element of said reaction chamber pack comprises a tubular resistive heater element.

5. The apparatus according to claim 1, where the walls of said pressure shell are made from at least one of the following metals: stainless steel, titanium and aluminum.

6. The apparatus according to claim 1, where the walls of said pressure shell are made from a metal alloy.

7. The apparatus according to claim 1, wherein said reactant sources are divided into a first group and a second group, said first group comprising metallic reactants and said second group comprising nonmetallic reactants, whereby the sources of said first group use a first inflow channel and the sources of said second group use a second inflow channel.

8. The apparatus according to claim 7, wherein the sources of said first and second groups are each arranged superimposed in parallel, whereby each of the sources are connected at one end to said first and second inflow channels, respectively, wherein the other end of said first and second inflow channels is connected to said reaction chamber pack.

9. The apparatus according to claim 1, wherein a heating means is placed outside said reactant inflow channels.

10. An apparatus for growing compound thin films onto a substrate by subjecting the substrate to alternately repeated surface reactions of vapor-phase reactants for the purpose of forming a solid-state thin film, said apparatus comprising:
   a reaction chamber pack into which the substrate can be placed;
   a plurality of reactant sources from which the vapor-phase reactants used in a thin-film growth process can be fed in the form of gas-phase pulses into said reaction chamber pack; and
   a plurality of reactant inflow channels suited for connecting said reactant sources to said reaction chamber pack, wherein said reaction chamber pack, said reactant sources and said reactant inflow channels are all placed inside a pressure shell, and wherein said reaction chamber pack and said reactant sources are each provided with individual heating means, which are suited for heating said reaction chamber pack and each of said reactant sources in a fashion independently controllable from each other, wherein said heating means has a plurality of heatable components which are isolated from each other using active thermal insulation elements, and wherein said heating means comprises an envelope surrounding said reaction chamber pack, said envelope having a first heat-equalizing envelope placed to a side facing said reaction chamber pack, and a second heat-equalizing envelope placed to a side facing the pressure shell, wherein between the first and second heat-equalizing envelopes is adapted a heater element suited for heating the surfaces of the first and second heat-equalizing envelopes.

11. An apparatus for growing compound thin films onto a substrate by subjecting the substrate to alternately repeated surface reactions of vapor-phase reactants for the purpose of forming a solid-state thin film, said apparatus comprising:
   a reaction chamber pack into which the substrate can be placed;
   a plurality of reactant sources from which the vapor-phase reactants used in a thin-film growth process can be fed in the form of gas-phase pulses into said reaction chamber pack; and
   a plurality of reactant inflow channels suited for connecting said reactant sources to said reaction chamber pack, wherein said reaction chamber pack, said reactant sources and said reactant inflow channels are all placed inside a pressure shell, and wherein said reaction chamber pack and said reactant sources are each provided with individual heating means, which are suited for heating said reaction chamber pack and each of said reactant sources in a fashion independently controllable from each other, and wherein said heating means has a plurality of heatable components which are isolated from each other using active thermal insulation elements, wherein said heating means of said reactant sources are formed by an envelope enclosing each of said reactant sources, said envelope having a first heat-equalizing envelope placed to a side facing said reactant sources, and a second heat-equalizing envelope placed to a side facing the pressure shell, wherein between the first and second heat-equalizing envelopes is a adapted a heater element suited for heating the surfaces of the first and second heat-equalizing envelopes.

12. The apparatus according to claim 11, wherein said active thermal insulation element of said reactant sources comprises at least one thermal radiation reflecting envelope adapted about the heater element of each of said reactant sources.

13. The apparatus according to claim 12, wherein the heater element of said reactant sources comprises a tubular heater element.

14. An apparatus for growing compound thin films onto a substrate by subjecting the substrate to alternately repeated surface reactions of vapor-phase reactants for the purpose of forming a solid-state thin film, said apparatus comprising:
   a reaction chamber pack into which the substrate can be placed;
   a plurality of reactant sources from which the vapor-phase reactants used in a thin-film growth process can be fed in the form of gas-phase pulses into said reaction chamber pack; and
   a plurality of reactant inflow channels suited for connecting said reactant sources to said reaction chamber pack, wherein said reaction chamber pack, said reactant sources and said reactant inflow channels are all placed inside a pressure shell, and wherein said reaction chamber pack and said reactant sources are each provided with individual heating means, which are suited for heating said reaction chamber pack and each of said reactant sources in a fashion independently controllable from each other, and wherein said heating means has a plurality of heatable components which are isolated from each other using active thermal insulation elements, and wherein the pressure shell is equipped with a door having a wall facing the interior of the pressure shell provided with a means for heating said door.

15. The apparatus according to claim 14, wherein said reactant inflow channels are disposed within the pressure shell on the side facing said door, said channels being heatable with the help of the heating means of said door.

16. An apparatus for growing compound thin films onto a substrate by subjecting the substrate to alternately repeated surface reactions of vapor-phase reactants for the purpose of forming a solid-state thin film, said apparatus comprising:
   a reaction chamber pack into which the substrate can be placed;
   a plurality of reactant sources from which the vapor-phase reactants used in a thin-film growth process can be fed in the form of gas-phase pulses into said reaction chamber pack; and
   a plurality of reactant inflow channels suited for connecting said reactant sources to said reaction chamber pack, wherein said reaction chamber pack, said reactant sources and said reactant inflow channels are all placed inside a pressure shell, and wherein said reaction chamber pack and said reactant sources are each provided with individual heating means, which are suited for heating said reaction chamber pack and each of said reactant sources in a fashion independently controllable from each other, wherein said heating means has a plurality of heatable components which are isolated from each other using active thermal insulation elements, and wherein an exhaust pipe of nonreacted reaction components is connected to said reaction chamber pack, wherein said pipe is disposed in a cool part of the pressure shell so that condensation of the nonreacted reaction components occurs therein.

* * * * *